(12) United States Patent
Napadensky

(10) Patent No.: US 9,334,402 B2
(45) Date of Patent: *May 10, 2016

(54) COMPOSITIONS AND METHODS FOR USE IN THREE DIMENSIONAL MODEL PRINTING

(71) Applicant: STRATASYS LTD., Rehovot (IL)

(72) Inventor: Eduardo Napadensky, Netanya (IL)

(73) Assignee: STRATASYS LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/538,492

(22) Filed: Nov. 11, 2014

(65) Prior Publication Data

US 2015/0129798 A1 May 14, 2015

Related U.S. Application Data

(63) Continuation of application No. 13/917,111, filed on Jun. 13, 2013, now Pat. No. 8,883,392, which is a continuation of application No. 13/361,357, filed on Jan. 30, 2012, now Pat. No. 8,481,241, which is a continuation of application No. 12/963,577, filed on Dec. 8, 2010, now Pat. No. 8,106,107, which is a continuation of application No. 12/342,210, filed on Dec. 23, 2008, now Pat. No. 7,851,122, which is a continuation of application No. 11/518,295, filed on Sep. 11, 2006, now Pat. No. 7,479,510, which is a continuation of application No. 11/098,690, filed on Apr. 5, 2005, now Pat. No. 7,183,335, which is a continuation of application No. 10/414,732, filed on Apr. 29, 2003, now abandoned, which is a continuation-in-part of application No. 09/803,108, filed on Mar. 12, 2001, now Pat. No. 6,569,373.

(60) Provisional application No. 60/188,698, filed on Mar. 13, 2000, provisional application No. 60/195,321, filed on Apr. 10, 2000.

(51) Int. Cl.
| | | |
|---|---|---|
| C08L 71/00 | (2006.01) |
| B29C 67/00 | (2006.01) |
| B41M 3/00 | (2006.01) |
| G03F 7/00 | (2006.01) |
| C08F 22/10 | (2006.01) |
| C08L 33/08 | (2006.01) |
| C08L 35/02 | (2006.01) |
| B33Y 70/00 | (2015.01) |

(52) U.S. Cl.
CPC .............. *C08L 71/00* (2013.01); *B29C 67/0059* (2013.01); *B29C 67/0092* (2013.01); *B41M 3/006* (2013.01); *C08F 22/10* (2013.01); *C08L 33/08* (2013.01); *C08L 35/02* (2013.01); *G03F 7/0037* (2013.01); *B33Y 70/00* (2014.12); *Y10T 428/31554* (2015.04)

(58) Field of Classification Search
CPC ......... C08L 71/00; C08L 33/08; C08L 35/02; B33Y 70/00; B29C 67/0059; B29C 67/0092; B41M 3/0006; G03F 7/0037
See application file for complete search history.

(56) References Cited

U.S. PATENT DOCUMENTS

| | | | |
|---|---|---|---|
| 3,533,905 | A | 10/1970 | O'Meara, Jr. |
| 3,803,109 | A | 4/1974 | Nemoto et al. |
| 3,804,736 | A | 4/1974 | Pasternack |
| 3,813,462 | A | 5/1974 | Roberts |
| 4,056,453 | A | 11/1977 | Barzynski et al. |
| 4,303,924 | A | 12/1981 | Young, Jr. |
| 4,575,330 | A | 3/1986 | Hull |
| 4,942,001 | A | 7/1990 | Murphy et al. |
| 4,942,060 | A | 7/1990 | Grossa |
| 5,002,854 | A | 3/1991 | Fan et al. |
| 5,041,161 | A | 8/1991 | Cooke et al. |
| 5,059,266 | A | 10/1991 | Yamane et al. |
| 5,076,947 | A | 12/1991 | Kaneoya et al. |
| 5,094,935 | A | 3/1992 | Vassiliou et al. |
| 5,136,515 | A | 8/1992 | Helinski |
| 5,149,548 | A | 9/1992 | Yamane et al. |
| 5,192,559 | A | 3/1993 | Hull et al. |
| 5,198,159 | A | 3/1993 | Nakamura et al. |
| 5,204,055 | A | 4/1993 | Sachs et al. |
| 5,236,812 | A | 8/1993 | Vassiliou et al. |
| 5,256,717 | A | 10/1993 | Stauffer et al. |
| 5,270,368 | A | 12/1993 | Lent et al. |
| 5,287,435 | A | 2/1994 | Cohen et al. |
| 5,340,433 | A | 8/1994 | Crump |
| 5,348,693 | A | 9/1994 | Taylor et al. |
| 5,387,380 | A | 2/1995 | Cima et al. |
| 5,490,962 | A | 2/1996 | Cima et al. |

(Continued)

FOREIGN PATENT DOCUMENTS

| | | |
|---|---|---|
| EP | 0388129 | 9/1990 |
| EP | 0 393672 | 10/1990 |
| EP | 0410412 | 1/1991 |
| EP | 0426363 | 5/1991 |
| EP | 0590957 | 4/1994 |
| EP | 0646580 | 4/1995 |

(Continued)

*Primary Examiner* — Nathan M Nutter
(74) *Attorney, Agent, or Firm* — Pearl Cohen Zedek Latzer Baratz LLP

(57) ABSTRACT

A method for printing three dimensional objects and support compositions are disclosed. The composition includes at least one curable component and at least one non-curable component, the non-curable component being a polyol, a glycol or water, wherein none of said non-curable components is reactive with any of said curable components. The composition has a first viscosity of 20-500 cps at ambient temperature and a second viscosity of less than 20 cps at temperature higher than the ambient temperature. The composition results in a solid, a semi solid or a gel type material after radiation.

15 Claims, 3 Drawing Sheets

(56) References Cited

U.S. PATENT DOCUMENTS

| | | |
|---|---|---|
| 5,495,029 A | 2/1996 | Steinmann et al. |
| 5,503,785 A | 4/1996 | Crump et al. |
| 5,510,226 A | 4/1996 | Lapin et al. |
| 5,534,368 A | 7/1996 | Morris et al. |
| 5,549,697 A | 8/1996 | Caldarise |
| 5,594,652 A | 1/1997 | Penn et al. |
| 5,629,133 A | 5/1997 | Wolf et al. |
| 5,658,334 A | 8/1997 | Caldarise et al. |
| 5,663,212 A | 9/1997 | Wakata et al. |
| 5,674,921 A | 10/1997 | Regula et al. |
| 5,695,707 A | 12/1997 | Almquist et al. |
| 5,695,708 A | 12/1997 | Karp et al. |
| 5,705,316 A | 1/1998 | Steinmann et al. |
| 5,707,780 A | 1/1998 | Lawton et al. |
| 5,717,599 A | 2/1998 | Menhennett et al. |
| 5,784,279 A | 7/1998 | Barlage, III et al. |
| 5,807,437 A | 9/1998 | Sachs et al. |
| 5,833,914 A | 11/1998 | Kawaguchi |
| 5,855,836 A | 1/1999 | Leyden et al. |
| 5,889,084 A | 3/1999 | Roth |
| 5,902,537 A | 5/1999 | Almquist et al. |
| 5,932,625 A | 8/1999 | Watanabe et al. |
| 5,939,011 A | 8/1999 | White et al. |
| 5,943,235 A | 8/1999 | Earl et al. |
| 5,985,204 A | 11/1999 | Otsuka et al. |
| 6,030,199 A | 2/2000 | Tseng |
| 6,096,796 A | 8/2000 | Watanabe et al. |
| 6,117,612 A | 9/2000 | Halloran et al. |
| 6,136,252 A | 10/2000 | Bedal et al. |
| 6,136,497 A | 10/2000 | Melisaris et al. |
| 6,165,406 A | 12/2000 | Jang et al. |
| 6,193,923 B1 | 2/2001 | Leyden et al. |
| 6,259,962 B1 | 7/2001 | Gothait |
| 6,327,363 B1 | 12/2001 | Henderson et al. |
| 6,347,257 B1 | 2/2002 | Bedal et al. |
| 6,350,403 B1 | 2/2002 | Melisaris et al. |
| 6,406,658 B1 | 6/2002 | Manners et al. |
| 6,467,897 B1 | 10/2002 | Wu et al. |
| 6,490,496 B1 | 12/2002 | Dacey |
| 6,508,971 B2 | 1/2003 | Leyden et al. |
| 6,520,084 B1 | 2/2003 | Gelbart |
| 6,532,394 B1 | 3/2003 | Earl et al. |
| 6,569,373 B2 | 5/2003 | Napadensky |
| 6,635,412 B2 | 10/2003 | Afromowitz |
| 6,658,314 B1 | 12/2003 | Gothait |
| 6,682,688 B1 | 1/2004 | Higashi et al. |
| 6,685,869 B2 | 2/2004 | Yamamura et al. |
| 6,863,859 B2 | 3/2005 | Levy |
| 6,936,212 B1 | 8/2005 | Crawford |
| 6,984,352 B1 | 1/2006 | Akopyan |
| 7,183,335 B2 | 2/2007 | Napadensky |
| 7,329,379 B2 | 2/2008 | Boyd et al. |
| 7,479,510 B2 | 1/2009 | Napadensky et al. |
| 7,851,122 B2 | 12/2010 | Napadensky |
| 2002/0008333 A1 | 1/2002 | Napadensky et al. |
| 2002/0008335 A1 | 1/2002 | Leyden et al. |
| 2002/0011693 A1 | 1/2002 | Leyden et al. |
| 2002/0016386 A1 | 2/2002 | Napadensky |
| 2002/0167101 A1 | 11/2002 | Tochimoto et al. |
| 2003/0082487 A1 | 5/2003 | Burgess |
| 2003/0114936 A1 | 6/2003 | Sherwood et al. |
| 2003/0207959 A1 | 11/2003 | Napadensky et al. |
| 2004/0156478 A1 | 8/2004 | Appleby et al. |
| 2004/0187714 A1 | 9/2004 | Napadensky et al. |
| 2005/0023710 A1 | 2/2005 | Brodkin et al. |
| 2005/0069784 A1 | 3/2005 | Gothait et al. |
| 2005/0165648 A1 | 7/2005 | Razumov |

FOREIGN PATENT DOCUMENTS

| | | |
|---|---|---|
| EP | 0655317 | 5/1995 |
| EP | 0666163 | 8/1995 |
| EP | 0 737 585 | 1/1999 |
| EP | 0 852 536 | 9/2002 |
| JP | 63 102936 | 5/1988 |
| WO | WO 89/10801 | 11/1989 |
| WO | WO 91/12120 | 8/1991 |
| WO | WO 92/00820 | 1/1992 |
| WO | WO 95/05935 | 3/1995 |
| WO | WO 95/05943 | 3/1995 |
| WO | WO 95/12485 | 5/1995 |
| WO | WO 97/11837 | 4/1997 |
| WO | WO 97/31781 | 9/1997 |
| WO | WO 98/09798 | 3/1998 |
| WO | WO 00/11092 | 3/2000 |
| WO | WO 00/62994 | 10/2000 |
| WO | WO 01/26023 | 4/2001 |
| WO | WO 03/028985 | 4/2003 |
| WO | WO 2004/082252 | 9/2004 |

COMPOSITIONS AND METHODS FOR USE IN THREE DIMENSIONAL MODEL PRINTING

CROSS REFERENCE TO RELATED APPLICATIONS

This patent application is a continuation application of U.S. patent application Ser. No. 13/917,111, filed Jun. 13, 2013 and issued as U.S. Pat. No. 8,883,392, which in turn is a continuation application of prior U.S. patent application Ser. No. 13/361,357, filed Jan. 30, 2012 and issued as U.S. Pat. No. 8,481,241, which in turn is a continuation application of prior U.S. patent application Ser. No. 12/963,577, filed Dec. 8, 2010 and issued as U.S. Pat. No. 8,106,107, which in turn is a continuation application of prior patent application Ser. No. 12/342,210, filed Dec. 23, 2008 and issued as U.S. Pat. No. 7,851,122, which in turn is a continuation application of prior U.S. patent application Ser. No. 11/518,295, filed Sep. 11, 2006 and issued as U.S. Pat. No. 7,479,510, which in turn is a continuation application of prior U.S. patent application Ser. No. 11/098,690, filed Apr. 5, 2005 and issued as U.S. Pat. No. 7,183,335, which in turn is a continuation application of prior U.S. application Ser. No. 10/424,732, filed Apr. 29, 2003, now abandoned, which in turn is a Continuation-in-part application of U.S. patent application Ser. No. 09/803,108, filed Mar. 12, 2001 and issued as U.S. Pat. No. 6,569,373, which claims the benefit of Provisional application No. 60/188,698, filed Mar. 13, 2000 and Provisional application No. 60/195,321 filed Apr. 10, 2000, each of which are incorporated in its entirety by reference herein.

FIELD OF THE INVENTION

The present invention relates to three-dimensional object building in general and to methods and compositions for use in three-dimensional printing of complex structures in particular.

BACKGROUND OF THE INVENTION

Three-dimensional printing, which typically works by building parts in layers, is a process used for the building up of three-dimensional objects. Three-dimensional printing is relatively speedy and flexible, allowing for the production of prototype parts, tooling and rapid manufacturing of three-dimensional complex structures directly from a CAD file, for example.

Using three-dimensional printing may enable a manufacturer to obtain a full three-dimensional model of any proposed product before tooling, thereby possibly substantially reducing the cost of tooling and leading to a better synchronization between design and manufacturing. A lower product cost and improved product quality may also be obtained.

Using three-dimensional printing also enables the direct manufacturing of full three-dimensional objects, thereby substantially reducing costs and leading to a better synchronization between design, production and consumption (use). A lower product cost and improved product quality may thus also be obtained.

Various systems have been developed for computerized three-dimensional printing. In U.S. Pat. No. 6,259,962 to the Assignees of the present application, and incorporated herein by reference, embodiments of an apparatus and a method for three-dimensional model printing are described. The apparatus according to some embodiments in this patent include a printing head having a plurality of nozzles, a dispenser connected to the printing head for selectively dispensing interface material in layers, and curing means for optionally curing each of the layers deposited. The depth of each deposited layer may be controllable by selectively adjusting the output from each of the plurality of nozzles.

In U.S. Pat. No. 6,658,314 to the Assignees of the present invention, and incorporated herein by reference, embodiments are described including an apparatus and a method for three-dimensional model printing. Some embodiments of this application describe a system and a method for printing complex three-dimensional models by using interface materials having different hardness or elasticity and mixing the interface material from each of the printing heads to control the hardness of the material forming the three-dimensional model. The construction layers of the model may be formed from interface material having a different (harder) modulus of elasticity than the material used to form the release (and support) layers, thereby allowing for the forming of complex shapes.

Radiation curable inks are disclosed in, for example, U.S. Pat. Nos. 4,303,924, 5,889,084, and 5,270,368. U.S. Pat. No. 4,303,924 discloses, inter alia, radiation curable compositions for jet-drop printing containing multifunctional ethylenically unsaturated material, monofunctional ethylenically unsaturated material, a reactive synergist, a dye colorant and an oil soluble salt. U.S. Pat. No. 5,889,084 discloses, inter alia, a radiation curable ink composition for ink-jet printing which includes a cationically photoreactive epoxy or vinyl ether monomer or oligomer, a cationic photo-initiator and a coloring agent. U.S. Pat. No. 5,270,368 discloses, inter alia, a UV curable ink composition for ink-jet printing including a resin formulation having at least two acrylate components, a photo-initiator and an organic carrier.

The ink compositions disclosed in these references are typically formulated for use in ink-jet printing. Compositions for ink-jet printing are typically formulated differently from compositions for building three-dimensional objects, and thus have different properties. For example, high viscosity at room temperature is a desirable property for three-dimensional objects, and thus compositions for building three-dimensional objects are typically designed to have a high viscosity at room temperature. In contrast, compositions for ink-jet printing are designed to have low viscosity at room temperature in order to function well in the printing process. None of the above-mentioned references disclose compositions that are especially formulated for three-dimensional printing.

Radiation curable compositions for stereolithography are disclosed in U.S. Pat. No. 5,705,316. U.S. Pat. No. 5,705,316 discloses compounds having at least one vinyl ether group, which also contain in the molecule at least one other functional group such as an epoxy or an acrylate group; compositions including these compounds; and methods of producing three-dimensional objects using these compositions. The compounds of U.S. Pat. No. 5,705,316 are complex molecules that are not readily available and thus need to be especially synthesized, which incurs additional time and costs.

Thus, there is a need for simple, easily obtainable curable compositions that are specially formulated to construct a three-dimensional object. There is further a need for simple, easily obtainable curable compositions, that are specially formulated to provide support to a three-dimensional object, by forming support/and or release layers around the object during its construction. Lastly, there is a need for methods of constructing a three-dimensional object by using the above mentioned compositions.

SUMMARY OF THE INVENTION

The present invention relates to compositions for use in the manufacture of three-dimensional objects. The present invention further relates to compositions for use as a support and/or release material in the manufacture of the three-dimensional objects. The present invention further relates to a method for the preparation of a three-dimensional object by three-dimensional printing, and to a three-dimensional object obtained by the method.

There is thus provided, in accordance with an embodiment of the present invention, a composition for use in the manufacture of three-dimensional objects by a method of selective dispensing. The composition may include, inter alia, at least one reactive component, at least one photo-initiator, at least one surface-active agent, and at least one stabilizer.

The composition has a first viscosity above 50 cps at room temperature, and a second viscosity compatible with ink-jet printers at a second temperature, wherein the second temperature is higher than room temperature.

In accordance with an embodiment of the present invention, the reactive component is an acrylic component, a molecule having one or more epoxy substituents, a molecule having one or more vinyl ether substituents, vinylcaprolactam, vinylpyrolidone, or any combination thereof.

Furthermore, in accordance with an embodiment of the present invention, the reactive component is an acrylic component. The acrylic component is an acrylic monomer, an acrylic oligomer, an acrylic crosslinker, or any combination thereof.

Furthermore, in accordance with an embodiment of the present invention, the reactive component may include, inter alia, an acrylic component and in addition a molecule having one or more epoxy substitutents, a molecule having one or more vinyl ether substituents, vinylcaprolactam, vinylpyrolidone, or any combination thereof.

Furthermore, in accordance with an embodiment of the present invention, the reactive component may include, inter alia, an acrylic component and vinylcaprolactam.

Furthermore, in accordance with an embodiment of the present invention, the reactive component may include, inter alia, a molecule having one or more vinyl ether substitutents.

Furthermore, in accordance with an embodiment of the present invention, the reactive component may include, inter alia, a molecule having one or more epoxy substituents.

Furthermore, in accordance with an embodiment of the present invention, the reactive component may include, inter alia, a molecule having one or more vinyl ether substituents, and a molecule having one or more epoxy substitutents.

Furthermore, in accordance with an embodiment of the present invention, the photo-initiator is a free radical photo-initiator, a cationic photo-initiator, or any combination thereof.

Furthermore, in accordance with an embodiment of the present invention, the composition further includes at least one pigment and at least one dispersant. The pigment is a white pigment, an organic pigment, an inorganic pigment, a metal pigment or a combination thereof. In one embodiment, the composition further includes a dye.

Furthermore, in accordance with an embodiment of the present invention, the first viscosity of the composition is greater than 80 cps. In one embodiment, the first viscosity is between 80 and 300 cps. In another embodiment, the first viscosity is around 300 cps.

Furthermore, in accordance with an embodiment of the present invention, the second viscosity of the composition is lower than 20 cps at a second temperature, which is greater than 60° C. Preferably, the second viscosity is between 8 and 15 cps at the second temperature, which is greater than 60° C. In one embodiment, the second viscosity is about 11 cps at a temperature around 85° C.

In addition, in accordance with another embodiment of the present invention, there is thus provided a composition for use as a support and/or release material in the manufacture of three-dimensional objects by a method of selective dispensing. The composition may include, inter alia, at least one non-reactive and low toxicity compound, at least one surface-active agent and at least one stabilizer.

The composition has a first viscosity above 50 cps at room temperature, and a second viscosity compatible with ink-jet printers at a second temperature, wherein the second temperature is higher than room temperature.

In accordance with an embodiment of the present invention, the composition may further include, inter alia, at least one reactive component and at least one photo-initiator. The reactive component is at least one of an acrylic component, a molecule having one or more vinyl ether substituents, or the reactive component is a water miscible component that is, after curing, capable of swelling upon exposure to water or to an alkaline or acidic water solution.

Furthermore, in accordance with an embodiment of the present invention the reactive component is an acrylic component. The acrylic component is an acrylic oligomer, an acrylic monomer, or a combination thereof.

Furthermore, in accordance with an embodiment of the present invention, the reactive component may include, inter alia, at least one water miscible component that is, after curing, capable of swelling upon exposure to water or to an alkaline or acidic water solution. The water miscible component is preferably an acrylated urethane oligomer derivative of polyethylene glycol, a partially acrylated polyol oligomer, an acrylated oligomer having hydrophillic substituents, or any combination thereof. The hydrophilic substituents are preferably acidic substituents, amino substituents, hydroxy substituents, or any combination thereof.

Furthermore, in accordance with an embodiment of the present invention, the reactive component may include, inter alia, a molecule having one or more vinyl ether substituents.

Furthermore, in accordance with an embodiment of the present invention, the non-reactive component is polyethylene glycol, methoxy polyethylene glycol, glycerol, ethoxylated polyol, or propylene glycol.

Furthermore, in accordance with an embodiment of the present invention, the photo-initiator is a free radical photo-initiator, a cationic photo-initiator, or a combination thereof.

Furthermore, in accordance with an embodiment of the present invention, the first viscosity of the composition is greater than 80 cps. In one embodiment, the first viscosity is between 80 and 300 cps. In another embodiment, the first viscosity is around 200 cps.

Furthermore, in accordance with an embodiment of the present invention, the second viscosity of the composition is lower than 20 cps at a second temperature, which is greater than 60° C. Preferably, the second viscosity is between 8 and 15 cps at the second temperature, which is greater than 60° C. In one embodiment, the second viscosity is about 11 cps at a temperature around 85° C.

In addition, there is thus provided, in accordance with an embodiment of the present invention, a method for preparation of a three-dimensional object by three-dimensional printing. The method according to an embodiment includes: dispensing a first interface material from a printing head, wherein the first interface material may include, inter alia, at least one reactive component, at least one photo-initiator, at least one surface-active agent and at least one stabilizer; dispensing a second interface material from the printing head, wherein the second interface material may include, inter alia, at least one non-reactive and low toxicity compound, at least one surface-active agent, and at least one stabilizer; and combining the first interface material and the second interface material in pre-determined proportions to produce construction layers for forming the three-dimensional object.

Furthermore, in accordance with an embodiment of the present invention, the reactive component of the first interface material is an acrylic component, a molecule having one or more epoxy substituents, a molecule having one or more vinyl ether substituents, vinylpyrolidone, vinylcaprolactam, or any combination thereof.

Furthermore, in accordance with an embodiment of the present invention, the reactive component of the first interface material may include, inter alia, an acrylic component. The acrylic component is an acrylic monomer, an acrylic oligomer, an acrylic crosslinker, or any combination thereof.

Furthermore, in accordance with an embodiment of the present invention, the reactive component of the first interface material may include, inter alia, an acrylic component and in addition a molecule having one or more epoxy substituents, a molecule having one or more vinyl ether substituents, vinylcaprolactam, vinylpyrolidone, or any combination thereof.

Furthermore, in accordance with an embodiment of the present invention, the reactive component of the first interface material may include, inter alia, an acrylic component and vinylcaprolactam.

Furthermore, in accordance with an embodiment of the present invention, the reactive component of the first interface material is a molecule having one or more vinyl ether substituents.

Furthermore, in accordance with an embodiment of the present invention, the reactive component of the first interface material is a molecule having one or more epoxy substituents.

Furthermore, in accordance with an embodiment of the present invention, the reactive component of the first interface material may include, inter alia, a molecule having one or more epoxy substituents, and a molecule having one or more vinyl ether substituents.

Furthermore, in accordance with an embodiment of the present invention, the first interface material may further include, inter alia, at least one pigment and at least one dispersant. The pigment is a white pigment, an organic pigment, an inorganic pigment, a metal pigment or a combination thereof. In one embodiment, the first interface material may further include, inter alia, a dye.

Furthermore, in accordance with an embodiment of the present invention, the method may further include the step of curing the first interface material.

Furthermore, in accordance with an embodiment of the present invention, the second interface material further may include, inter alia, at least one reactive component and at least one photo-initiator. The reactive component is at least one of an acrylic component, a molecule having one or more vinyl ether substituents, or the reactive component is a water miscible component that is, after curing, capable of swelling upon exposure to water or to an alkaline or acidic water solution.

Furthermore, in accordance with an embodiment of the present invention the reactive component is an acrylic component. The acrylic component is an acrylic oligomer, an acrylic monomer, or a combination thereof.

Furthermore, in accordance with an embodiment of the present invention, the reactive component may include, inter alia, at least one water miscible component that is, after curing, capable of swelling upon exposure to water or to an alkaline or acidic water solution. The water miscible component is preferably an acrylated urethane oligomer derivative of polyethylene glycol, a partially acrylated polyol oligomer, an acrylated oligomer having hydrophillic substituents, or any combination thereof. The hydrophilic substituents are preferably acidic substituents, amino substituents, hydroxy substituents, or any combination thereof.

Furthermore, in accordance with an embodiment of the present invention, the reactive component of the second interface material may include, inter alia, a molecule having one or more vinyl ether substituents.

Furthermore, in accordance with an embodiment of the present invention, the non-reactive component is polyethylene glycol, methoxy polyethylene glycol, glycerol, ethoxylated polyol, or propylene glycol.

Furthermore, in accordance with an embodiment of the present invention, the photo-initiator of the first interface material and optionally of the second interface material is a free radical photo-initiator, a cationic photo-initiator or any combination thereof.

Furthermore, in accordance with an embodiment of the present invention, the method may further include the step of irradiating or curing the second interface material.

Furthermore, in accordance with an embodiment of the present invention, the first interface material and the second interface material have a different modulus of elasticity and a different strength. In one embodiment, the first interface material has a higher modulus of elasticity and a higher strength than the second interface material.

Furthermore, in accordance with an embodiment of the present invention, the method may further include the step of forming a multiplicity of support layers for supporting the object. In one embodiment, the support layers are formed by combining the first interface material and the second interface material in pre-determined proportions. In one embodiment, the support layers have the same modulus of elasticity and the same strength as the construction layers. In another embodiment, the support layers have a lower modulus of elasticity and a lower strength than the construction layers.

Furthermore, in accordance with an embodiment of the present invention, the method may further include the step of combining the first interface material and the second interface material in pre-determined proportions to form a multiplicity of release layers for releasing the support layers from the object. In one embodiment, the release layers have a lower modulus of elasticity and a lower strength than the construction layers and the support layers.

Furthermore, in accordance with an embodiment of the present invention, the first interface material and the second interface material each have a first viscosity at room temperature, and a second viscosity compatible with ink-jet printers at a second temperature, which may be the same or different, wherein the second temperature is higher than room temperature.

In addition, there is thus provided, in accordance with another embodiment of the present invention, a three-dimensional object comprised of a core consisting of a multiplicity of construction layers. The construction layers are prepared by combining pre-determined proportions of the first interface material and the second interface material, described hereinabove.

Furthermore, in accordance with an embodiment of the present invention, the object may further include a multiplicity of support layers for supporting the core. In one embodiment, the support layers are prepared by combining pre-determined proportions of the first interface material and a second interface material. In one embodiment, the support layers have the same modulus of elasticity and the same strength as the construction layers. In another embodiment, the support layers have a lower modulus of elasticity and a lower strength than the construction layers.

Furthermore, in accordance with a preferred embodiment of the present invention, the object may further include a multiplicity of release layers for releasing the support layers from the core. In one embodiment, the release layers are positioned between the support layers and the construction layers. The release layers are prepared by combining pre-determined proportions of the first interface material and a second interface material. In one embodiment, the release layers have a lower modulus of elasticity and a lower strength than the construction layers and the support layers.

One embodiment of the present invention provides a composition suitable for building a three-dimensional object, the composition may include, inter alia, a curable component, having a functional group, wherein if the functional group is a polymerizable reactive functional group, then the functional group is a (meth)acrylic functional group, a photo-initiator, a surface-active agent and a stabilizer, wherein the composition has a first viscosity of about 50-500 cps at a first temperature, wherein the first temperature is ambient temperature, and a second viscosity lower than 20 cps at a second temperature wherein the second temperature is higher than the first temperature, wherein, after curing, the composition results in a solid form.

One embodiment of the present invention provides a composition suitable for support in building a three-dimensional object, the composition may include, inter alia, a non-curable component, a curable component, wherein the non-curable component is not reactive with the curable component, a surface-active agent and a stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a solid, a semi solid or a liquid material.

One embodiment of the present invention provides a composition suitable for support in building a three-dimensional object, the composition may include, inter alia, a non-curable component, a curable (meth)acrylic component, wherein the non-curable component is not reactive with the curable component, a surface-active agent, a free radical photo-initiator and a stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a solid, a semi solid or a liquid material.

One embodiment of the present invention further provides a composition suitable for support in building a three-dimensional object, the composition may include, inter alia, at least one non-curable component, at least one curable component including a molecule having one or more epoxy substituents, wherein the non-curable component is not reactive with the curable component, at least one surface-active agent, at least one cationic photo-initiator and at least one stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a solid, a semi solid or a liquid material.

One embodiment of the present invention further provides a method for the preparation of a three-dimensional object by three-dimensional printing, the method may include the steps of dispensing a first composition suitable for building a three-dimensional object from a dispenser, the first composition may include a curable component, having a functional group, wherein if the functional group is a polymerizable reactive functional group, then the functional group is a (meth)acrylic functional group, a photo-initiator, a surface-active agent, and a stabilizer, dispensing a second composition suitable for support in building a three-dimensional object from a dispenser, the second composition may include a non-curable component, a curable component, wherein the non-curable component is not reactive with the curable component, a surface-active agent and a stabilizer, combining the first composition and the second composition in pre-determined proportions to produce a multiplicity of construction layers for forming the three-dimensional object, whereby the first composition is cured resulting in a solid form, and whereby the second composition is irradiated or cured resulting in a liquid, a solid or a semi-solid form.

One embodiment of the present invention further provides a three-dimensional object comprised of a multiplicity of construction layers, wherein the construction layers are prepared by combining pre-determined proportions of a first composition and a second composition according to the invention.

BRIEF DESCRIPTION OF THE DRAWINGS

The present invention will be understood and appreciated more fully from the following detailed description taken in conjunction with the appended drawings in which.

DETAILED DESCRIPTION OF THE INVENTION

The present invention relates to compositions for use in the manufacture of three-dimensional objects, and to compositions for use as support and/or release material in the manufacture of three-dimensional objects. The present invention further relates to a method for the preparation of a three-dimensional object by three-dimensional printing, using the above-mentioned compositions, and to a three-dimensional object obtained by the method.

The composition for use in the manufacture of the three-dimensional objects may include, inter alia, at least one reactive component, at least one photo-initiator, at least one surface-active agent and at least one stabilizer. The composition may be formulated so as to be compatible for use with ink-jet printers and to have a viscosity at room temperature above 50 cps.

The composition for use as a support and/or second interface material in the manufacture of the three-dimensional objects may include, inter alia, at least one non-reactive and low-toxicity component, at least one surface-active agent and at least one stabilizer. The composition may further contain at least one reactive component and at least one photo-initiator. The composition is formulated so as to be compatible for use with ink-jet printers and to have a viscosity at room temperature above 50 cps.

The compositions will be described in further detail below.

Figure 1:
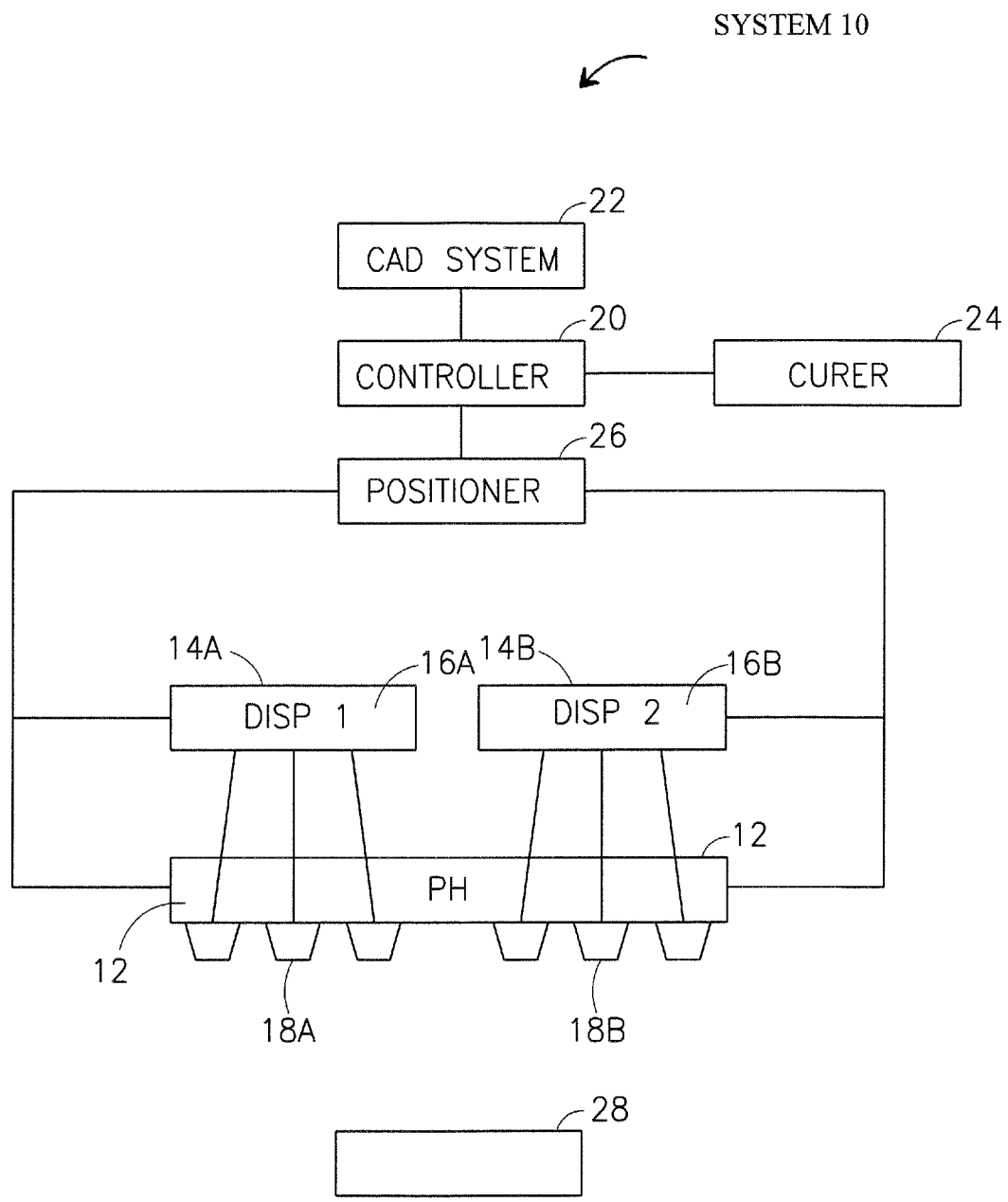
FIG. 1 is a schematic illustration of an embodiment of a three-dimensional printing system.

The three-dimensional object of the present invention may be built using, for example, a three-dimensional printing system similar to embodiments of U.S. Pat. No. 6,658,314, assigned to the Assignees of the present application and incorporated herein by reference, although other suitable three-dimensional printers may be used. A three-dimensional printing system is shown in FIG. 1, to which reference is now made. FIG. 1 is an illustration of a three-dimensional printing system, generally designated 10, which includes one or more printing heads, referenced 12, and at least two dispensers generally referenced 14 and individually referenced 14a and 14b, containing interface materials, generally referenced 16 and individually referenced 16a and 16b, respectively. Other components, and other sets of components, may be used.

Printing head 12 has a plurality of ink-jet type nozzles 18, through which interface materials 16a and 16b are jetted. In one embodiment of the present invention, first dispenser 14a is connected to a first set of nozzles, referenced 18a, and second dispenser 14b is connected to a second set of nozzles, referenced 18b. Thus, first interface material 16a is jetted through nozzles 18a, and second interface material 16b is jetted through nozzles 18b. Alternatively, in another embodiment (not shown), the three-dimensional printing system may include at least two printing heads. The first printing head is connected to first dispenser 14a and is used to jet first interface material 16a; and the second printing head is connected to second dispenser 14b is used to jet second interface material 16b.

The three-dimensional printing system 10 further includes a controller 20, a Computer Aided Design (CAD) system 22, curing unit 24, and optionally a positioning apparatus 1. The controller 20 is coupled to the CAD system 22, curing unit 24, positioning apparatus 1, printing head 12 and each of the dispensers 14. Control may be effected by other units than shown, such as one or more separate units.

The three-dimensional object being produced (28) is built in layers, the depth of each layer typically being controllable by selectively adjusting the output from each of the ink-jet nozzles 18.

By combining or mixing materials from each of the dispensers, wherein each dispenser contains interface material having a different hardness, it is possible to adjust and control the hardness of the material forming the three-dimensional object being produced. Thus, by combining the first and second interface materials being output from each of the dispensers, respectively, different parts of the three-dimensional object having a different modulus of elasticity and a different strength may be produced.

As used hereinafter, the term "strength" is used as a relative term to indicate the difference in modulus of elasticity among interface materials. The strength of a material may be described, for example, by reference to its modulus of elasticity, which may be defined as: "the ratio of stress to its corresponding strain under given conditions of load, for materials that deform elastically, according to Hooke's law".

In accordance with one embodiment of the present invention, the first dispenser 14a contains a first interface material 16a, referred to hereinafter as the "first interface material" or "first composition", and the second dispenser 14b contains a second interface material 16b, referred to hereinafter as the "second interface material" or "second composition". The first interface material has a different (harder) modulus of elasticity and a greater strength than the second interface material. By combining the first interface material and the second interface material, different layers of the three-dimensional object having a different modulus of elasticity and a different strength may be produced, such as, for example, a model or "construction" layer (otherwise known as a model construction), a support layer (otherwise known as a support construction) and a release layer (otherwise known as a release construction), as defined hereinbelow. In accordance with some embodiments of the present invention, each layer of materials deposited by the apparatus during the printing process, may include a combination of model constructions, support constructions and/or release constructions, according to the requirements of the three-dimensional object being printed. Thus, when referring herein to construction layers, support layers and/or release layers, any or all of these may be part or parts comprising a single whole 'layer' printed by the printing apparatus during the printing process.

For example, combining the first interface material and the second interface material forms a multiplicity of construction layers, which are defined as the layers constituting the three-dimensional object. Multiplicity, as used hereinafter, refers to a number which is one or greater.

Further, combining the first interface material and the second interface material may form a multiplicity of support layers, which are defined as the layers supporting the three-dimensional object, and not constituting the three-dimensional object.

Further, combining the first interface material and the second interface material may form a multiplicity of release layers, which are defined as the layers (not constituting the three-dimensional object) for separating the three-dimensional object layer from layers such as the support layers. The release layers typically have a lower modulus of elasticity and a lower strength than the construction layers and the support layers.

In one embodiment of the present invention, the support layers are designed substantially exactly as the construction layers, and thus have substantially the same modulus of elasticity and substantially the same strength as the construction layers. In this way, the construction layers form a core, and the support layers look like the negative printing of the core. The release layers are positioned between the construction layers and the support layers, and are used to separate the construction layers from the support layers.

In one embodiment of the present invention, the support layers have a lower modulus of elasticity and a lower strength than the construction layers. The support layers may be separated from the construction layers by taking advantage of their weaker properties, as will be explained in detail below. Alternatively, the support layers may be separated from the construction layers by positioning release layers between the construction layers and the support layers.

Figure 2:
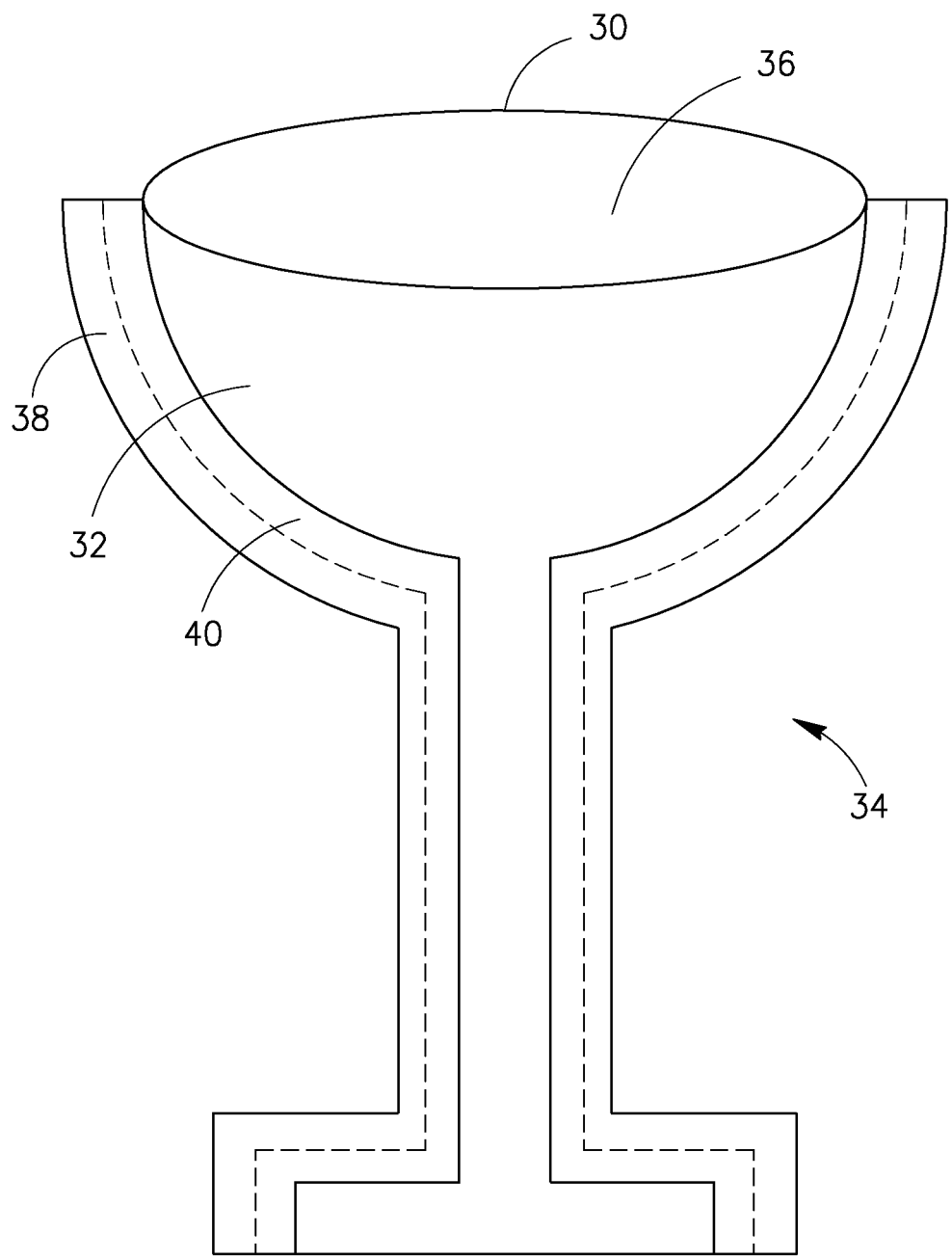
FIG. 2 is an elevational view of a three-dimensional object, constructed in accordance with an embodiment of the present invention.

In order to more clearly define the present invention, reference is now made to FIG. 2, which is a three-dimensional model of a wineglass, generally referenced 30. This three-dimensional model is printed using the ink-jet type printing system of FIG. 1. combining the first interface material and the second interface material to form a multiplicity of construction layers 32 which make up wine glass 30.

The construction layers 32 of wineglass 30 need to be supported externally, such as in the area referenced 34. Furthermore, an internal void, referenced 36, needs to be formed during printing. Thus a multiplicity of support layers 38, formed by combining the first interface material and the second interface material, are printed.

Furthermore, combination of the first interface material and the second interface material forms a multiplicity of release layers 40. In one embodiment of the present invention, release layers 40 are positioned between construction layers 32 and support layers 38. Generally, release layers 40 have a different (lower) modulus of elasticity than support layers 38 and construction layers 32. Thus release layers 40 may be used to separate support layers 38 from construction layers 32.

The present invention, which will now be described in detail, provides compositions suitable for use as the first interface and as the second interface material.

The first interface material and second interface material of the present invention are especially designed and formulated for building a three-dimensional object using three-dimensional printing. Accordingly, in accordance with an embodiment of the present invention, the first interface material and the second interface material each have a first viscosity at room temperature, and a second viscosity compatible with ink-jet printers at a second temperature, which may be the same or different, wherein the second temperature is higher than room temperature, which is defined as about 20-30° C.

In one embodiment of the present invention, the first and the second interface materials are designed to have increased viscosity at room temperature, which is defined as about 20-30° C. In another embodiment, the first and second interface material have a viscosity greater than 50 cps at room temperature, In another embodiment, the viscosity may be between 80 and 300 cps. In another embodiment, the first and the second interface material may have a viscosity of around 300 cps at room temperature.

In one embodiment of the present invention, the first interface material and the second interface material may have a second viscosity compatible with ink-jet printing, at a second temperature which may be higher than room temperature. In another embodiment, a composition compatible with ink-jet printing may have a low viscosity, for example, below 20 cps at the printing temperature, in order to function properly in the printing process. In another embodiment, the first interface material and the second interface material, upon heating, have a viscosity preferably below 20 cps that may enable the construction of the three-dimensional object under heat. In one embodiment of the present invention, the temperature typically used to build the three-dimensional model of the present invention is higher than 60° C. In another embodiment, the temperature may be about 85° C. In one embodiment of the present invention, the first and second interface materials may have a viscosity of 8-15 cps at a temperature greater than 60° C. In another embodiment, the first and second interface materials may have a viscosity of 11 cps at a temperature of about 85° C.

Having this viscosity, the first and second interface material in one embodiment may be distinguished from prior art formulations designed for ink-jet printing, which have low viscosity at room temperature, the temperature at which the printing is normally conducted. High viscosity at room temperature is a desirable property for three-dimensional objects, a feature that is lacking in the prior art formulations. Of course, other embodiments may have other viscosities.

First Interface Material

The first interface material (typically, the model material) is a composition suitable for building a three-dimensional object. The composition may be formulated to give, after curing, a solid material. In one embodiment, this invention describes a composition that after curing results in a solid material, with mechanical properties that permit the building and handling of that three-dimensional object. In another embodiment, this invention provides a composition that upon curing results in a solid elastomer like material, with mechanical properties that permit the building and handling of the three-dimensional object.

One embodiment of the present invention provides a first interface material of the present invention may include, inter alia, at least one reactive component, at least one photo-initiator, at least one surface-active agent and at least one stabilizer.

One embodiment of the present invention provides a composition suitable for building a three-dimensional object, the composition may include, inter alia, a curable component, having a functional group, wherein if the functional group is a polymerizable reactive functional group, then the functional group is a (meth)acrylic functional group, a photo-initiator, a surface-active agent and a stabilizer, wherein the composition has a first viscosity of about 50-500 cps at a first temperature, wherein the first temperature is ambient temperature, and a second viscosity lower than 20 cps at a second temperature wherein the second temperature is higher than the first temperature, wherein, after curing, the composition results in a solid form.

In one embodiment of the present invention, the first temperature is a room temperature. In another embodiment, the room temperature is between 20-30° C. In another embodiment, the first temperature is ambient temperature. In another embodiment, ambient temperature is between 10-40° C. In another embodiment, ambient temperature is between 15-35° C. In another embodiment, ambient temperature is between 20-30° C.

In one embodiment of the present invention, the second temperature is higher than 40° C. In another embodiment, the second temperature is higher than 50° C. In another embodiment, the second temperature is higher than 60° C. In another embodiment, the second temperature is higher than 70° C.

In one embodiment of the present invention, the curable component is a reactive component, which is able to undergo polymerization. In one embodiment of the present invention, the curable component may be a (meth)acrylic monomer, a (meth)acrylic oligomer, a (meth)acrylic crosslinker, or any combination thereof.

In one embodiment of the present invention, the curable component may be a combination of a mono-functional monomer and a di-functional oligomer.

In one embodiment of the present invention, the mono-functional monomer is a high Glass Transition Temperature mono-functional monomer. In another embodiment, the di-functional oligomer is a low Glass Transition Temperature di-functional oligomer. The term Glass transition temperature (Tg) is defined as the temperature at which a polymer changes from hard and brittle to soft and pliable material.

In one embodiment of the present invention, the Glass Transition Temperature of the mono-functional monomer may be higher than 60° C. In another embodiment, the Glass Transition Temperature of the mono-functional monomer may be higher than 70° C. In another embodiment, the Glass Transition Temperature of the mono-functional monomer may be in the range of 70-110° C.

In one embodiment of the present invention, the Glass Transition Temperature of the di-functional oligomer may be lower than 40° C. In another embodiment, the Glass Transition Temperature of the di-functional oligomer may be lower than 30° C. In another embodiment, the Glass Transition Temperature of the di-functional oligomer may be in the range of 20-30° C.

One embodiment of the present invention provides a composition wherein the Glass Transition Temperature of the mono-functional monomer is higher than 70° C. and wherein the Glass Transition Temperature of the di-functional oligomer is lower than 40° C.

In one embodiment of the present invention, the composition may include at least 20% of the high Glass Transition Temperature mono-functional monomer. In another embodiment, the composition may include at least 30% of the high Glass Transition Temperature mono-functional monomer. In another embodiment, the composition may include at least 40% of the high Glass Transition Temperature mono-functional monomer. In another embodiment, the composition may include between 20-40% of the high Glass Transition Temperature mono-functional monomer. In another embodiment, the composition may include between 30-60% of the high Glass Transition Temperature mono-functional monomer.

In one embodiment of the present invention, the composition may include about 20% of the low Glass Transition Temperature di-functional oligomers. In another embodiment, the composition may include about 40% of the low Glass Transition Temperature di-functional oligomers. In another embodiment, the composition may include between 20-40% of the low Glass Transition Temperature di-functional oligomers. In another embodiment, the composition may include at least 20% of the low Glass Transition Temperature di-functional oligomer. In another embodiment, the composition may include not more than 40% of the low Glass Transition Temperature di-functional oligomer.

In one embodiment of the present invention, the composition may include at least 40% of the high Glass Transition Temperature mono-functional monomers and at least 20% of the low Glass Transition Temperature di-functional oligomer.

In one embodiment of the present invention, the composition may include at least 20% of the high Glass Transition Temperature mono-functional monomers and not more than 40% of the low Glass Transition Temperature di-functional oligomer.

An acrylic monomer is a functional acrylated molecule which may be, for example, esters of acrylic acid and methacrylic acid. Momoners may be mono-functional or multi-functional (for example, di-, tri-, tetra-functional, and others). An example of an acrylic mono-functional monomer for the present invention is phenoxyethyl acrylate, marketed by Sartomer under the trade name SR-339. An example of an acrylic di-functional monomer is propoxylated (2) neopentyl glycol diacrylate, marketed by Sartomer under the trade name SR-9003.

An acrylic oligomer is a functional acrylated molecule which may be, for example, polyesters of acrylic acid and methacrylic acid. Other examples of acrylic oligomers are the classes of urethane acrylates and urethane methacrylates. Urethane-acrylates are manufactured from aliphatic or aromatic or cycloaliphatic diisocyanates or polyisocyanates and hydroxyl-containing acrylic acid esters. An example is a urethane-acrylate oligomer marketed by Cognis under the trade name Photomer-6010.

An acrylic crosslinker is a molecule which may provide enhanced crosslinking density. Examples of such resins are Ditrimethylolpropane Tetra-acrylate (DiTMPTTA), Pentaerythitol Tetra-acrylate (TETTA), Dipentaerythitol Penta-acrylate (DiPEP). In one embodiment of the present invention, the composition may further includes, inter alia, a curable component, which is a molecule having one or more epoxy substituents, a molecule having one or more vinyl ether substituents, vinylcaprolactam, vinylpyrolidone, or any combination thereof. In one embodiment of the present invention, the composition may further include, inter alia, vinylcaprolactam. Other curable components may also be used.

The first interface material may also include a curable component which is, for example, a molecule having one or more vinyl ether substituents. In one embodiment of the present invention, the concentration of component that includes a molecule having one or more vinyl ether substituents is in the range of 10-30%. In another embodiment, the concentration is 15-20%. In another embodiment, the concentration is 15%. Of course, other concentrations, and other ranges, can be used. Conventional vinyl ether monomers and oligomers which have at least vinyl ether group are suitable. Examples of vinyl ethers are ethyl vinyl ether, propyl vinyl ether, isobutyl vinyl ether, cyclohexyl vinyl ether, 2-ethylhexyl vinyl ether, butyl vinyl ether, ethyleneglocol monovinyl ether, diethyleneglycol divinyl ether, butane diol divinyl ether, hexane diol divinyl ether, cyclohexane dimethanol monovinyl ether and the like. An example of a vinyl ether for the present invention is 1,4 cyclohexane dimethanol divinyl ether, marketed by ISP under the trade name CHVE.

In one embodiment of the present invention, the first interface material may also include a curable component which is a molecule having one or more epoxy substituents. In one embodiment of the present invention, conventional epoxy monomers and oligomers which have at least one oxirane moiety may be used. Non-limiting examples of suitable epoxy containing molecules are displayed in Table 1 below (note other suppliers may be used for suitable materials):

TABLE 1

Examples of epoxy-containing curable component

| Trade Name | Type of Material | Supplier |
| --- | --- | --- |
| ERL-4299 or UVR-6128 | Bis-(3,4 cyclohexylmethyl) adipate | Union Carbide |
| UVR-6105 and UVR-6110 | 3,4-epoxy cyclohexylmethyl-3,4-epoxycyclohexyl carboxylate | Union Carbide |
| D.E.R 732 | Aliphatic epoxy, Polyglycol diglycidyl ether | Dow chemicals |
| Vinylcyclohexene Monoxide | 1,2 epoxy-4-vinylcyclohexane | Union Carbide |
| D.E.N. 431 | Epoxy novolac resin | Dow corning |
| UVR-6216 | 1,2-epoxy hexadecane | Union Carbide |
| UVI-6100 | Cycloaliphatic epoxide diluent | Union Carbide |
| Vikoflex 7170 | Fullyl epoxidized soy bean oil | Elf Atochem, INC. |
| ERL-4221D | 3,4-epoxy cyclohexylmethyl 3,4-epoxy cyclohexane carboxylate | Union Carbide |

In one embodiment of the present invention, the first interface material may include any combination of an acrylic component as defined hereinabove, a molecule having one or more epoxy substituents as defined hereinabove, a molecule having one or more vinyl ether substituents as defined hereinabove, vinylcaprolactam and vinylpyrolidone.

In one embodiment of the present invention, the curable component of the first interface material includes, inter alia, an acrylic monomer, an acrylic oligomer, an acrylic crosslinker and vinylcaprolactam. In another embodiment, the curable component includes an acrylic component as defined hereinabove and a molecule having one or more epoxy substituents as defined hereinabove. In another embodiment, the curable component of the first interface material includes an acrylic component as defined hereinabove and a molecule having one or more vinyl ether substituents as defined hereinabove. In another embodiment, the curable component in the first interface material includes a molecule having one or more vinyl ether substituents as defined hereinabove, and a molecule having one or more epoxy substituents as defined hereinabove.

The photo-initiator of the first interface material and of the second interface material may be the same or different, and is a free radical photo-initiator, a cationic photo-initiator, or any combination thereof.

The free radical photo-initiator may be any compound that produces a free radical on exposure to radiation such as ultraviolet or visible radiation and thereby initiates a polymerization reaction. Non-limiting examples of some suitable photo-initiators include benzophenones (aromatic ketones) such as benzophenone, methyl benzophenone, Michler's ketone and xanthones; acylphosphine oxide type photo-initiators such as 2,4,6-trimethylbenzolydiphenyl phosphine oxide (TMPO), 2,4,6-trimethylbenzoylethoxyphenyl phosphine oxide (TEPO), and bisacylphosphine oxides (BAPO's); benzoins and bezoin alkyl ethers such as benzoin, benzoin methyl ether and benzoin isopropyl ether and the like. Examples of photo-initiators are alpha-amino ketone, marketed by Ciba Specialties Chemicals Inc. (Ciba) under the trade name Irgacure 907, and bisacylphosphine oxide (BAPO's), marketed by Ciba under the trade name I-819.

The free-radical photo-initiator may be used alone or in combination with a co-initiator. Co-initiators are used with initiators that need a second molecule to produce a radical that is active in the UV-systems. Benzophenone is an example of a photoinitiator that requires a second molecule, such as an amine, to produce a curable radical. After absorbing radiation, benzophenone reacts with a ternary amine by hydrogen abstraction, to generate an alpha-amino radical which initiates polymerization of acrylates. Non-limiting example of a class of co-initiators are alkanolamines such as triethylamine, methyldiethanolamine and triethanolamine.

Suitable cationic photo-initiators for the present invention include compounds which form aprotic acids or Bronstead acids upon exposure to ultraviolet and/or visible light sufficient to initiate polymerization. The photo-initiator used may be a single compound, a mixture of two or more active compounds, or a combination of two or more different compounds, i.e. co-initiators. Non-limiting examples of suitable cationic photo-initiators are aryldiazonium salts, diaryliodonium salts, triarylsulphonium salts, triarylselenonium salts and the like. In one embodiment, a cationic photo-initiator for the present invention may be a mixture of triarylsolfonium hexafluoroantimonate salts marketed by Union Carbide as UVI-6974.

In one embodiment of the present invention, the composition suitable for building a three-dimensional object may further include a curable compound, which is a sulfur-containing component. In one embodiment of the present invention, the sulfur containing component is beta mercaptopropionate, mercaptoacetate, alkane thiols or any combination thereof. The addition of sulfur-containing components may significantly enhance the composition reactivity. At levels of about 5% of sulfur-containing component a significant reactivity enhancement is achieved. The mechanical properties of the composition may be determined depending on the sulfur-containing component used. The reactivity enhancement achieved by the use of sulfur-containing component, enables the incorporation in the polymerization reaction of non sulfur-containing components, which would not easily polymerize otherwise. Molecules having unsaturated double bonds, for example, low molecular weight polybuthadiene, are polymerized in the claimed compositions when contained an appropriate sulfur-containing component. For example, a basic composition will contain 15% low molecular weight unsaturated molecule, 5% sulfur-containing component, 15% mono-functional monomer, 15% di-functional monomer and the rest other curable components according to the intended photopolymer properties. An example of a sulfur-containing component for the present invention is trimethylolpropane tri(3-mercaptopropionate), manufactured by BRUNO BOCK Chemische Fabrik GMBH & CO. Other suitable substances may be used.

In one embodiment of the present invention, the composition suitable for building a three-dimensional object, further includes, inter alia, a low molecular weight polymer. An example of a low molecular weight polymer for the present invention is Styrene-Butadiene-Methacrylate block copolymers (KRATON D), manufactured by Dow Corning. Other suitable substances may be used.

In one embodiment of the present invention, the composition suitable for building a three-dimensional object, further includes, inter alia, a filler.

The term filler is defined as an inert material added to a polymer, a polymer composition or other material to modify their properties and/or to adjust quality of the end products. The filler may be an inorganic particle, for example calcium carbonate, silica and clay. Of course other filler substances may be used.

Fillers may be introduced in to polymer compositions in order to reduce shrinkage during polymerization or during cooling, for example to reduce the coefficient of thermal expansion, increase strength, increase thermal stability reduce cost and/or adopt rheological properties. The use of standard fillers has also some drawbacks such as reduction of elasticity and an increase in viscosity. Additionally, large diameter fillers (>5 micron) are not appropriate for ink-jet applications.

Nano-particles fillers are especially useful in applications requiring low viscosity such as ink-jet applications. Compositions containing as much as 30% nano-particle fillers are feasible, whereas the same concentration of more standard and higher diameter fillers (~>1 micron) produce at such concentration viscosities which are too high for ink-jet applications. In one embodiment of the present invention, the nano-particle filler containing composition is clear. The composition is clear (e.g., transparent) since it contains no visual fillers. In contrast, compositions containing more standard and higher diameter visible fillers (~>1 micron), are not clear.

In one embodiment of the present invention, the composition optionally may contain pigments. In another embodiment, the pigment concentration may be lower than 35%. In another embodiment, the pigment concentration may be lower than 15%.

In one embodiment of the present invention, the filler may include particles such as particles having an average diameter of less than 100 nm. In another embodiment, the filler may include particles having a diameter in the range of 10-100 nm. In another embodiment, the filler may include particles having a diameter in the range of 20-80 nm. In another embodiment, the filler may include particles having a diameter in the range of 10-50 nm. In another embodiment, the filler may include particles having a diameter smaller than 10 nm Examples of fillers that may be used in the composition are HIGHLINK OG (particle size spanning between 9 nm to 50 nm), manufactured by Clariant, and NANOCRYL (particle size below 50 nm), manufactured by Hanse Chemie. Other suitable substances may be used.

It was discovered that phase separation may be induced during the radiation curing process of the present method. In one embodiment of the present invention, the phase separation may produce a clear material, which may have improved impact-resistance. This composition, upon bending develops micro-cracks, before breaking. These micro-cracks can easily be distinguished due to the whitening of the stress area or stress line. In another embodiment, the phase separation results in a non-clear cured material. It was discovered that certain combinations of UV curable components induce phase separation during curing. Such compositions are clear before curing and may be clear, hazy or opaque after curing. Such compositions have an improved impact strength and higher elongation, when compared to similar compositions, which do not show such phase separation. For example, it was discovered that the addition of some silicon containing oligomers, at levels as low as 5%, to the above described composition, may already create a substance which induces such phase separation. An example of a silicon acrylated molecule is Ebecryl 350, manufactured by UCB Chemicals. Of course other substances may be used.

One embodiment of the present invention provides a composition further includes a phase separation inducing component. In another embodiment, the phase separation inducing component is a silicon oligomer. In another embodiment, the concentration of the silicon oligomer is at least 5%.

In one embodiment of the present invention, phase separation may be induced during curing, resulting in a non-clear cured material. Certain combinations of UV curable composition suffer a phase separation process during curing. Such compositions are clear before curing and hazy to white after curing. Such compositions have an improved impact strength and higher elongation, when compared to similar compositions, which do not suffer from such phase separation. For example, the addition of some silicon containing oligomers, at levels as low as 5%, to the above described composition, may create a substance which suffers from such phase separation.

In one embodiment of the present invention, the first viscosity is about 80-500 cps. In another embodiment, the first viscosity is about 300 cps. Of course, compositions having other viscosities may be used.

In one embodiment of the present invention, the second viscosity is lower than 20 cps and wherein the second temperature is higher than 60° C. In another embodiment, the second viscosity is between 10 and 17 cps and wherein the second temperature is higher than 60° C. In another embodiment, the second viscosity is between 10 and 17 cps and wherein the second temperature is about 70-110° C. In another embodiment, the second viscosity is between 12 and 15 cps and wherein the second temperature is about 70-90° C. Of course, compositions having other viscosities may be used.

Other components of the first interface material and the second interface material of the present invention are surface-active agents and inhibitors (typically, thermal stabilizers). A surface-active agent may be used to reduce the surface tension of the formulation to the value required for jetting or for printing process, which is typically around 30 dyne/cm. An example of a surface-active agent for the present invention is silicone surface additive, marketed by Byk Chemie under the trade name Byk 307 Inhibitors may be employed in the formulations of the first interface material and the second interface material to permit the use of the formulation at high temperature, for example around 85° C., without causing thermal polymerization.

In one embodiment of the present invention, the composition may further include, inter alia, at least one pigment and at least one dispersant. In one embodiment of the present invention, the pigment may be a white pigment. In another embodiment, the pigment may be an organic pigment. In another embodiment, the pigment may be an inorganic pigment. In another embodiment, the pigment may be a metal pigment or a combination thereof. In one embodiment of the present invention, the composition may further include, inter alia, a dye. An example of a white pigment for the present invention is organic treated titanium dioxide, marketed by Kemira Pigments under the trade name UV TITAN M160 VEG. An example of an organic pigment for the present invention is an organic pigment marketed by Elementis Specialities under the trade name Tint Aid PC 9703. Examples of dispersants for the present invention are dispersants including a copolymer with acidic groups marketed by Byk Chemie under the trade name Disperbyk 110, and a dispersant including a high molecular weight block copolymer with pigment affinic groups, marketed by Byk Chemie under the trade name Disperbyk 163.

Furthermore, in one embodiment of the present invention, combinations of white pigments and dyes are used to prepare colored resins. In such combinations, the white pigment may have at least a double task: 1) to impart opacity; and 2) to shield the dye from UV radiation, to prevent bleaching of the resin. Thus, in accordance with one embodiment of the present invention, the first interface material further includes a dye. The dye may be chosen so as not to interfere with the curing efficiency of the formulation of the first interface material. The dye may be any of a broad class of solvent soluble dyes. Some non-limiting examples are azo dyes which are yellow, orange, brown and red; anthraquinone and triarylmethane dyes which are green and blue; and azine dye which is black. An example of a dye for the present invention is Solvent Red 127, marketed by Spectra Colors Corp. under the trade name Spectrasol RED BLG.

The relative proportions of the different components of the first interface material may vary. In one embodiment of the present invention, the first interface material includes the following components: 50% acrylic oligomer(s), 30% acrylic monomer(s), 15% acrylic crosslinker, 2% photoinitiator, surface active agent, pigments, and stabilizers. Of course, other compositions may be used.

Non-limiting examples of formulations of the first interface material are provided hereinbelow in Tables 2-4, to which reference is now made. Tables 2 and 3 illustrate examples of possible formulations of the first interface material. Table 4 illustrates examples of colored formulations, which include pigments, dispersants and dyes, as defined hereinabove. To any of the examples in Tables 2 and 3 may be added the combination of the colorants of Table 4. The individual substances, suppliers, combinations, etc., are given by way of example only.

TABLE 2

Examples of Characteristic Formulation Components of First Interface Material

| # | Trade Name | Chemical Type | Function in the formulation | Supplier |
|---|---|---|---|---|
| A | Photomer-6010 | Urethane Acrylate Oligomer | Oligomer | Cognis |
| B | SR-339 | Phenoxy ethyl Acrylate | monomer | Sartomer |
| C | SR-351 | Trimethylol propane triacrylate | Cross-linker | Sartomer |
| D | Irgacure 907 | alpha-Amino Ketone | Free radical photo-initiator | Ciba Specialties Chemical Inc. |
| E | BP | Benzophenone | Free radical photo-initiator | Satomer |

TABLE 2-continued

Examples of Characteristic Formulation Components of First Interface Material

| # | Trade Name | Chemical Type | Function in the formulation | Supplier |
|---|---|---|---|---|
| F | Triethanol Amine | 1. Ternary Amine | Free radical Coinitiator | Sigma |
| G | Byk 307 | Silicone Surface Additive | Surface agent | Byk Chemie |
| H | MEHQ | 4-Methoxy phenol | Inhibitor | Sigma |
| I | Cyracure UVR-6110 | 3,4 Epoxycyclohexyl-methyl-3,4-epoxycyclohexylcarboxylate | Epoxy oligomer | Union Carbide |
| J | UVI-6974 | Mixed Triarylsulfonium Hexafluoroantimonate Salts | Cationic photo-initiator | Union Carbide |
| K | CHVE | 1,4-cyclohexane dimethanol divinyl ether | Vinyl Ether Monomer | ISP |
| L | UV TITAN M160 VEG | Organic Treated Titanium Dioxide | White pigment | KEMIRA PIGMENTS |
| M | Disperbyk 110 | Copolimer with acidic groups | Pigment Dispersant | Byk Chemie |
| N | Spectrasol RED BLG | Solvent Red 127 | Dye | Spectra Colors Corp. |
| O | Tint Aid PC 9703 | Organic pigment | Organic pigment | Elementis Specialties |
| P | Disperbyk 163 | High molecular weight block copolymer with pigment affinic groups | Pigment Dispersant | Byk Chemie |
| Q | V-Cap | Vinylcaprolactam | Monomer | ISP |
| R | V-Pyrol | Vinylpyrolidone | Monomer | ISP |
| S | Silicon acrylated oligomer | Ebecryl 350 | Phase separation promoter | UCB Chemicals |
| T | Trimethylol propane tri(3-mercaptopropionate) | Sulfur-containing compound | Crosslinker | BRUNO BOCK Chemische Fabrik HMBH & CO. |

TABLE 3

Examples of Possible Formulation Compositions of First Interface Material

| Example | A | B | C | D | E | F | G | H | I | J | K | Q | R | S | T |
|---|---|---|---|---|---|---|---|---|---|---|---|---|---|---|---|
| 1 | X | X | X | X |   |   | X | X |   |   |   |   |   |   |   |
| 2 | X | X |   |   | X |   | X | X |   |   |   |   |   |   |   |
| 3 | X |   | X | X |   |   | X | X |   |   |   |   |   |   |   |
| 4 |   | X | X | X |   |   | X | X |   |   |   |   |   |   |   |
| 5 | X | X | X |   | X | X | X | X |   |   |   |   |   |   |   |
| 6 | X | X |   |   | X | X | X | X |   |   |   |   |   |   |   |
| 7 | X |   | X |   | X | X | X | X |   |   |   |   |   |   |   |
| 8 |   | X | X |   | X | X | X | X |   |   |   |   |   |   |   |
| 9 | X |   | X | X |   |   | X | X |   |   | X |   |   |   |   |
| 10 | X |   | X |   | X | X | X | X |   |   | X |   |   |   |   |
| 11 |   |   |   |   |   |   |   |   | X | X | X | X | X |   |   |
| 12 |   | X | X | X |   |   | X | X | X | X |   |   |   |   |   |
| 13 | X | X | X | X | X | X | X | X | X | X |   |   |   |   |   |
| 14 | X | X | X | X |   |   | X | X |   |   |   | X |   |   |   |
| 15 | X | X | X | X |   |   | X | X |   |   |   |   | X |   |   |
| 16 | X | X | X | X |   |   | X |   |   |   |   | X |   | X |   |
| 17 | X | X | X | X |   |   | X |   |   |   |   |   | X |   | X |

TABLE 4

Examples of colored formulations of first interface material

| Example | L | M | N | O | P |
|---|---|---|---|---|---|
| 16 | X | X | | | |
| 17 | X | X | X | | |
| 18 | X | X | | X | X |
| 19 | | | | X | X |
| 20 | | | X | X | X |

In one embodiment of the present invention, the formulation of the first interface material is presented in entry No. 14 of Table No. 3. According one embodiment of the present invention, the first interface material includes:

an acrylic oligomer, which may be any acrylic oligomer as defined hereinabove, and which may be an urethane acrylate oligomer;

an acrylic monomer, which may be any acrylic monomer as defined hereinabove, and which may be phenoxy ethyl acrylate;

an acrylic crosslinker, which may be any acrylic crosslinker as defined hereinabove, and which may be trimethylol propane triacrylate;

a radical photo-initiator, which may be any radical photo-initiator as defined hereinabove, and which may be alpha-amino ketone;

a surface agent, which may be a silicone surface additive;
an inhibitor, which may be 4-methoxyphenol; and
vinylcaprolactam.

Second Interface Material

The second interface material (in one embodiment, the support material) is a composition typically formulated to support the building of a three-dimensional object. In one embodiment of the present invention, the second interface material is formulated to form a release layer to permit a manual easy separation or cleaning of the three-dimensional object from its support.

In one embodiment of the present invention, the second interface material may be one of two different principle kinds: 1) a liquid material lacking any curable groups that remains liquid even after irradiation. In one embodiment, the liquid is water miscible and is easily washed out by water, or with other material. In another embodiment the liquid is non water-miscible and is easily washed out by water or by a water detergent solution and 2) a solid or semi-solid material that is formulated as a weak curable material. The solid or semi-solid material, when cured, may be capable of swelling in water or in alkaline or acidic water or water detergent solution. Thus, when cured, the second interface material may swell and almost break upon exposure to water, or in alkaline or acidic water or water detergent solution, with minimum manual work required. In both cases the second interface material is formulated so as to permit fast, easy and efficient removal of the second interface material and cleaning of the three-dimensional model from its support.

In one embodiment, the second interface material of the present invention may include, inter alia, at least one non-reactive and low toxicity compound, at least one surface-active agent and at least one stabilizer.

One embodiment of the present invention provides a composition suitable for support in building a three-dimensional object, the composition may include, inter alia, a non-curable component, a curable component, wherein the non-curable component is not reactive with the curable component, a surface-active agent, and a stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a semi solid material. Of course, compositions having other viscosities may be used.

In one embodiment of the present invention, the composition suitable for support in building a three-dimensional object, after irradiation, may result in a semi-solid material. In another embodiment, the semi-solid material may be gel type material. In another embodiment, the composition may result in a liquid material. In another embodiment, the composition results in a solid material that is formulated as a weak curable material. In another embodiment, upon irradiation, the composition results in a material that is capable of swelling in water or in alkaline or acidic water. Thus, when irradiated, the second interface material swells and almost breaks upon exposure to water, with minimum manual work required.

In one embodiment of the present invention, the second interface material is formulated so as to permit fast, easy and efficient removal of the second interface material and cleaning of the three-dimensional model from its support.

In one embodiment of the second invention, the curable component is a reactive component. In another embodiment of the present invention, the reactive component can undergo polymerization. According to one embodiment, the second interface material is formulated as a curable composition that is capable of solidifying upon curing. In one embodiment of the second invention, the curable components may be similar to those used in the first interface material, but chosen specifically to give a hydrophillic cured resin, with weak mechanical properties. Thus, upon curing, a solid composition is formed that is weak and can be easily pulverized for example by hand or using water.

In one embodiment of the present invention, the curable component may be a (meth)acrylic component. In another embodiment, the (meth)acrylic component may be a (meth)acrylic monomer. In another embodiment, the (meth)acrylic component may be a (meth)acrylic oligomer. In another embodiment, the (meth)acrylic component may be a (meth)acrylic crsosslinker. In another embodiment, the (meth)acrylic component may be any combination of a (meth)acrylic monomer, a (meth)acrylic oligomer and a (meth)acrylic crsosslinker.

In one embodiment of the present invention, the composition may further include, inter alia, at least one photo-initiator. In one embodiment of the present invention, the photo-initiator may a free radical photo-initiator, a cationic photo-initiator, or any combination thereof. The photo-initiator may be any photo-initiator, as defined above.

One embodiment of the present invention provides a composition suitable for support in building a three-dimensional object, the composition may include, inter alia, a non-curable component, a curable (meth)acrylic component, wherein the non-curable component is not reactive with the curable component, a surface-active agent, a free radical photo-initiator and a stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a solid, a semi-solid or a liquid material.

In one embodiment of the present invention, the composition may further include, inter alia, water. In one embodiment of the present invention, the composition further includes a water miscible component that is, after irradiation or curing, capable of dissolving or swelling upon exposure to water, to an alkaline or acidic water solution or to water detergent solution. In another embodiment, the water miscible component is a (meth)acrylated urethane oligomer derivative of polyethylene glycol, a partially (meth)acrylated polyol oligomer, a (meth)acrylated oligomer having hydrophillic substituents, polyethylene glycol mono or di(meth)acrylated, acrylamide, Acryloylmorpholine(ACMO) or any combination thereof. In another embodiment, the hydrophilic substituents are acidic substituents, amino substituents, hydroxy substituents, ionic substituents or any combination thereof.

Non-limiting examples of acrylic components for use in the second interface material of the present invention are polyethylene glycol monoacrylate, marketed by Laporte under the trade name Bisomer PEA6, polyethylene glycol diacrylate, marketed by Sartomer under the trade name SR-610, methoxypolyethyleneglycole 550 monomethacrylate, and the like.

In one embodiment of the present invention, the curable component of the second interface material may be a water miscible component that is, after curing, capable of swelling upon exposure to water or to an alkaline or acidic water solution. Non-limiting examples of water miscible components for the present invention are an acrylated urethane oligomer derivative of polyethylene glycol—polyethylene glycol urethane diacrylate, a partially acrylated polyol oligomer, an acrylated oligomer having hydrophillic substituents, or any combination thereof. The hydrophilic substituents are acidic substituents, amino substituents, hydroxy substituents, or any combination thereof. An example of an acrylated monomer with hydrophillic substituents is betha-carboxyethyl acrylate, which contains acidic substituents.

In one embodiment of the present invention, the curable component of the second interface material may also be a molecule having one or more vinyl ether substituents, which may be any of the compounds as defined hereinabove. In one embodiment of the present invention, the concentration of component that includes a molecule having one or more vinyl ether substituents is in the range of 10-30%. In another embodiment, the concentration is 15-20%. In another embodiment, the concentration is 15%. Other concentrations may also be used. An example of vinyl ether for the second interface material is 1,4-cyclohexane dimethanol divinyl ether, marketed by ISP under the trade name CHVE. Other molecules having one or more vinyl ether substituents may be used.

In one embodiment of the present invention, the curable component of the second interface material is an acrylic oligomer. In another embodiment, the curable component of the second interface material is a combination of an acrylic component as defined hereinabove and a water miscible component as defined hereinabove. In another embodiment, the curable component of the present invention is a combination of an acrylic component as defined hereinabove and a molecule having one or more vinyl ether substituents, as defined hereinabove. In another embodiment, the curable component of the present invention is a combination of a water miscible component as defined hereinabove, and a molecule having one or more vinyl ether substituents, as defined hereinabove. Other combinations may also be used.

In one embodiment of the present invention, the composition further includes, inter alia, a sulfur-containing component. In another embodiment, the sulfur containing component is beta mercaptopropionate, mercaptoacetate, alkane thiols or any combination thereof. The sulfur-containing component may be any sulfur-containing component, as defined above.

In one embodiment of the present invention, the non-curable component of the second interface material is a non-curable component. In another embodiment the non-curable component is non-polymerizing component. In another embodiment, the non-curable component is a low toxicity compound. In another embodiment, the non-curable component is a water miscible one. In another embodiment, the non-curable component is a non-water miscible one. In one embodiment of the present invention, the non-curable component is chosen to enhance the water-swelling rate, and to reduce the mechanical strength of the second interface material. High water diffusion rate is desirable in order to minimize the time needed for the water cleaning process of the three-dimensional model. Non-limiting examples of non-curable components for the present invention are polyethylene glycol marketed by Aldrich under the trade name PEG 400, methoxypolyethylene glycol marketed by Aldrich under the trade name methoxycarbowax 500 and 1000, propylene glycol and paraffin oil. Other examples are ethoxylated polyols and glycerol.

In one embodiment of the present invention, the second interface material is formulated as a liquid. The liquid formulation is a non-curable composition that remains liquid even after radiation exposure. Thus, the liquid formulation includes non-reactive components and does not include reactive components that are capable upon solidifying upon curing. In one embodiment of the present invention, the material may be water miscible, and may easily be washed out with water.

In one embodiment of the present invention, the non-curable component is polyethylene glycol, methoxypolyethylene glycol, glycerol, ethoxylated polyol, propylene glycol or any combination thereof. In another embodiment, the non-curable component is a non-water miscible compound. In another embodiment, the non-water miscible compound is paraffin oil. Other non-curable substances may be used.

One embodiment of the present invention further provides a composition suitable for support in building a three-dimensional object, the composition may include, inter alia, at least one non-curable component, at least one curable component including, inter alia, a molecule having one or more epoxy substituents, wherein the non-curable component is not reactive with the curable component, at least one surface-active agent, at least one cationic photo-initiator and at least one stabilizer, wherein the composition has a first viscosity of about 20-500 cps at a first temperature, wherein the first temperature is ambient temperature, and a second viscosity lower than 20 cps at a second temperature wherein the second temperature is higher than the first temperature, wherein, after irradiation, the composition results in a semi solid material.

In one embodiment of the present invention, the first temperature is a room temperature. In another embodiment, the room temperature is between 20-30° C. In another embodiment, the first temperature is ambient temperature. In another embodiment, ambient temperature is between 10-40° C. In another embodiment, ambient temperature is between 15-35° C. In another embodiment, ambient temperature is between 20-30° C.

In one embodiment of the present invention, the second temperature is higher than 40° C. In another embodiment, the second temperature is higher than 50° C. In another embodiment, the second temperature is higher than 60° C. In another embodiment, the second temperature is higher than 70° C.

Besides swelling, another characteristic of the support upon exposure to water or to an alkaline or acidic water or water detergent solution may be the ability to break down during exposure to water or to an alkaline or acidic water solution. In one embodiment of the present invention, because the second interface material is made of hydrophilic components, during the swelling process, internal forces appear and cause fractures and breakdown of the cured second interface material.

In addition, the second interface material may be at least partially water-soluble. At least part of the second interface material is may be completely water soluble/miscible. During the removal of the support and/or release layers, the water soluble/miscible components are extracted out with water.

In addition, in one embodiment of the present invention, the second interface material liberates bubbles upon exposure to water or to an alkaline water or acidic water solution. The bubbles are intended to help in the process of removal of the support and/or release layers from the construction layers.

In one embodiment of the present invention, the bubbles may be liberated by a bubble releasing substance (BRS) that is present in the water solution that is used to clean out the three-dimensional object. Such a substance may be a carbonate or bicarbonate, for example sodium bicarbonate (SBC). During the swelling process, at least part of the SBC is introduced or absorbed into the second interface material, where it is transformed into carbon dioxide gas ($CO_2$) and a water-soluble salt. The trigger for the production of $CO_2$ may be the reaction of the SBC with an acid functionality present in the second interface material. Such acid functionality may be introduced as part of the second interface material formulation or introduced later, after curing, using an acid water solution. For example, the first step may be to put the three-dimensional object with its support in a water solution containing a SBC, then to place the same object in an acidic solution. The acid will start to decompose the SBC and produces gas (bubbles).

In another embodiment, the substance that liberates gas is already present in the formulation of the second interface material. For example, the second interface material may contain calcium carbonate as a solid filler. In that case, the trigger is the introduction of the second interface material in a water or acidic solution.

It should be clear that a BRS is not limited to a sodium bicarbonate or calcium carbonate and an acidic water solution. Other chemical reagents and reactions may be used to achieve the same result—the production of bubbles inside the matrix of the second interface material. For example, the SBC may be any alkaline metal or alkaline earth metal carbonate or bicarbonate.

In one embodiment of the present invention, the non-curable component is a non-water miscible compound. In another embodiment, the non-water miscible compound is paraffin oil.

In one embodiment of the present invention, the composition further includes, inter alia, a filler. In another embodiment, the filler includes particles having a diameter of less than 1 micron.

In one embodiment of the present invention, the composition further includes a low molecular weight polymer.

In one embodiment of the present invention, the first viscosity composition suitable for support in building a three-dimensional object is about 30-200 cps.

In one embodiment of the present invention, the second viscosity of the composition suitable for support in building a three-dimensional object is lower than 20 cps. In another embodiment, the second viscosity is between 10 and 17 cps. In another embodiment, the second viscosity is between 12 and 16 cps.

Having these viscosities, the first and second interface material may be distinguished from certain prior art formulations designed for ink-jet printing, which may have low viscosity at room temperature, the temperature at which the printing is typically conducted. High viscosity at room temperature may be a desirable property for three-dimensional objects, a feature that may be lacking in the prior art formulations.

In one embodiment of the present invention, the composition further includes, inter alia, a component able to produce gas upon exposure to water or to an alkaline or acidic water solution. In another embodiment, the component is sodium bicarbonate, calcium bicarbonate or a combination thereof. Other suitable substances may be used.

In one embodiment of the present invention, the second interface composition further includes, inter alia, a pigment, a dye or a combination thereof. In another embodiment, the pigment is a white pigment, an organic pigment, an inorganic pigment, a metal pigment or a combination thereof.

Examples of formulations of the second interface material are provided hereinbelow in Table 5 and Table 6, to which reference is now made. Tables 5 and 6 display various formulations that are suitable for use as the second interface material. The individual substances, suppliers, combinations, etc., are given by way of example only.

TABLE 5

Examples of Characteristic Formulation Components of Second Interface Material

| # | Trade Name | Chemical Type | Function in the formulation | Supplier |
|---|---|---|---|---|
| A | SR-610 | Polyethylene Glycole (600) Diacrylate | Oligomer | Sartomer |
| B | Bisomer PEA6 | Polyethylene Glycole monoacrylate | Water swelling/ sensitive Oligomer | Laport |
| C | PEG 400 | Polyethylene Glycole 400 | Polymer (hydrophilic and plasticizer) | Aldrich |
| D | Irgacure 907 | alpha-Amino Ketone | Free radical photo-initiator Type I | Ciba Specialties Chemical Inc. |
| E | BP | Benzophenone | Free radical photo-initiator Type II | Satomer |
| F | Triethanol Amine | Ternary Amine | Free radical Coinitiator for Type II photo-initiator | Aldrich |
| G | Byk 307 | Silicone Surface Additive | Surface agent | Byk Chemie |
| H | MEHQ | 4-Methoxy phenol | Inhibitor (thermal stabilizer) | Sigma |
| I | PEG UA | Polyethylene glycol urethane diacrylate | Water swelling/sensitive oligomer | Home made |
| J | AP | Partially acrylated polyol | Water swelling/ sensitive oligomer | Home made |
| K | Betha-CEA | Betha-caboxyethyl acrylate | Acidic monomer | |
| M | CHVE | 1,4-Cyclohexane dimethanol divinyl ether | Vinyl ether monomer | ISP |
| N | Tone polyol 0301 | Caprolactone polyol | Polyol (plasticizer) | Union Cabide |
| O | Paraffin oil | Paraffin oil | plasticizer | Oldrich |
| P | methoxycarbo wax 500 and 1000 | methoxypolyethylene glycol | Polymer (hydrophilic and plasticizer) | |

TABLE 5-continued

Examples of Characteristic Formulation Components of Second Interface Material

| # | Trade Name | Chemical Type | Function in the formulation | Supplier |
|---|---|---|---|---|
| Q | SR 506 | Isobornyl Acrylate | monomer | Cray Valley |

TABLE 6

Examples of Possible Formulation Compositions of Second Interface Material

| Example | A | B | C | D | E | F | G | H | I | J | K | L | M | O | Q | N |
|---|---|---|---|---|---|---|---|---|---|---|---|---|---|---|---|---|
| 1  | X |   | X | X |   |   | X | X |   |   |   |   |   |   |   |   |
| 2  | X |   | X |   | X | X | X | X |   |   |   |   |   |   |   |   |
| 3  |   | X | X | X |   |   | X | X |   |   |   |   |   |   |   |   |
| 4  |   | X | X |   | X | X | X | X |   |   |   |   |   |   |   |   |
| 5  | X | X | X | X |   |   | X | X |   |   |   |   |   |   |   |   |
| 6  | X | X | X |   | X | X | X | X |   |   |   |   |   |   |   |   |
| 7  |   |   | X |   |   |   | X | X | X |   |   |   |   |   |   |   |
| 8  |   | X | X |   |   |   | X | X |   | X |   |   |   |   |   |   |
| 9  |   | X | X | X |   |   | X | X |   |   | X |   |   |   |   |   |
| 10 |   | X | X |   |   |   | X | X |   |   |   | X |   |   |   |   |
| 11 |   | X | X |   |   |   | X | X |   |   |   |   |   |   |   |   |
| 12 | X |   | X |   |   |   | X | X |   |   |   | X | X |   |   |   |
| 13 |   | X |   | X |   |   | X | X |   | X |   |   |   |   |   | X |
| 14 |   | X | X | X | X | X | X | X |   | X | X |   |   |   |   | X |
| 15 |   |   | X |   |   |   |   |   |   |   |   |   |   | X | X |   |

A formulation of the second interface material is presented in entry No. 3 of Table 6. According to this embodiment of the present invention, the second interface material includes: a water swelling oligomer, which may be any water swelling oligomer as defined hereinabove, and which may be polyethylene glycol; a non-curable component, which may be any non-curable component as defined hereinabove, and which may be polyethylene glycol; a radical photo-initiator, which may be any radical photo-initiator as defined hereinabove, and which may be alpha-amino ketone; a surface agent, which may be a silicone surface additive; and an inhibitor, which may be 4-methoxyphenol.

Another formulation of the second interface material is presented in entry No. 4 of Table 6. According to this embodiment of the present invention, the second interface material includes: a water swelling oligomer, which may be any water swelling oligomer as defined hereinabove, and which may be polyethylene glycole monoacrylate; a non-curable component, which may be any non-curable component as defined hereinabove, and which may be polyethylene glycole; a radical photo-initiator, which may be any radical photo-initiator as defined hereinabove, and which may be benzophenone; a co-initiator, which may be any co-initiator as defined hereinabove, and which may be triethanolamine; a surface agent, which may be a silicone surface additive; and an inhibitor, which may be 4-methoxyphenol.

The first interface material and the second interface material are suitable for use in, for example, the method for three-dimensional printing which is described in U.S. Pat. No. 6,658,314, assigned to the Assignees of the present application and is incorporated herein by reference. Other methods may be used.

Briefly, the method according to one embodiment includes: dispensing a first interface material from a printing head; dispensing a second interface material from the printing head; and combining the first interface material and the second interface material in pre-determined proportions to a produce a multiplicity of construction layers for forming the three-dimensional model.

Figure 3:
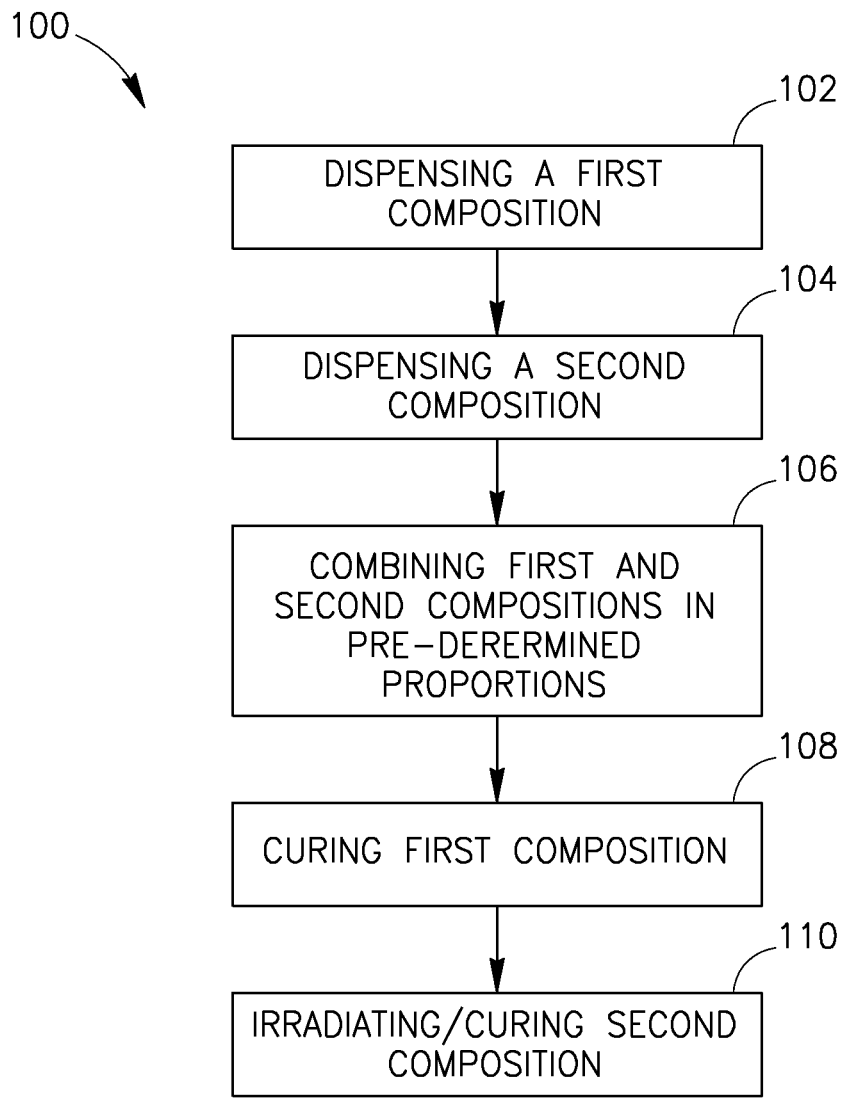
FIG. 3 is a schematic illustration of an embodiment of a method for the preparation of three-dimensional object by three-dimensional printing.

The method (FIG. 3) according to an embodiment of the present invention includes dispensing a first composition suitable for building a three-dimensional object from a dispenser (102), dispensing a second composition suitable for support in building a three-dimensional object from a dispenser (104), combining the first composition and the second composition in pre-determined proportions to produce a multiplicity of construction layers for forming the three-dimensional object (106), curing the first composition resulting in a solid form (108), and irradiating or curing second composition resulting in a liquid, a solid or a semi-solid form (110). Of course, the method may include other steps or series of steps.

One embodiment of the present invention further provides a method for the preparation of a three-dimensional object by three-dimensional printing, the method may include the steps of dispensing a first composition suitable for building a three-dimensional object from a dispenser, the first composition may include, inter alia, a curable component, having a functional group, wherein if the functional group is a polymerizable reactive functional group, then the functional group is a (meth)acrylic functional group, a photo-initiator, a surface-active agent; and a stabilizer, dispensing a second composition suitable for support in building a three-dimensional object from a dispenser, the second composition may include a non-curable component, a curable component, wherein the non-curable component is not reactive with the curable component, a surface-active agent and a stabilizer, combining the first composition and the second composition in pre-determined proportions to produce a multiplicity of construction layers for forming the three-dimensional object, whereby the first composition is cured resulting in a solid form, and whereby the second composition is irradiated or cured resulting in a liquid, a solid or a semi-solid form.

In one embodiment of the present invention, the method may further include the step of generating data for a pre-determined combination of the first composition and the second composition to produce a multiplicity of support layers for supporting the three-dimensional object.

In one embodiment of the present invention, the method may further include the step of generating data for a pre-determined combination of the first composition and the second composition to produce a multiplicity of release layers for releasing the three-dimensional object from the support layers.

In one embodiment of the present invention, the first composition and the second composition are dispensed simultaneously. In another embodiment, the first composition and the second composition are dispensed sequentially. In another embodiment, the first composition is dispensed first. In another embodiment, the second composition is dispensed first. In another embodiment, more than one first composition is used. In another embodiment, the more than one second composition is used.

In accordance with one embodiment of the present invention, the method further includes the step of curing the first interface material. Further, when the second interface material includes a curable component, the method may further include the step of curing the second interface material. Curing may be carried out for example, as described in U.S. Pat. No. 6,658,314. For example, the curing method is by radiation, such as Ultraviolet (UV) and/or Visible (Vis) and/or Infra Red (IR) and/or UV-Vis radiation and/or Electron Beam (EB). In one embodiment of the present invention, the curing method is UV-Vis radiation. Other suitable curing methods may be used.

In operation, in order to obtain layers of different modulus of elasticity and a different strength, the first interface material and the second interface material are combined in pre-determined proportions. For example, in order to obtain layers having a higher modulus of elasticity and a higher strength such as the construction layers, a suitable combination that contains mostly the first interface material may be used. Further, in order to obtain layers having a lower modulus of elasticity and a lower strength such as the release layers, a suitable combination that includes mostly the second interface material may be used.

By way of example, in order to produce the construction layers and/or the support layers, a combination that includes 90-100% of the first interface material and 0-10% of the second interface material may be used. Further, in order to produce the release layers, a combination that includes 0-10% of the first interface material and 90-100% of the second interface material may be used. In another embodiment, in order to produce support layers that have a lower modulus of elasticity and a lower strength than the construction layers, a combination that includes 30-70% of the first interface material and 70-30% of the second interface material may be used.

Thus, a three-dimensional object is produced which is included of a core consisting of a multiplicity of construction layers. The construction layers are formed by combining predetermined proportions of the first interface material and the second interface material.

One embodiment of the present invention further provides a three-dimensional object comprised of a multiplicity of construction layers, wherein the construction layers are prepared by combining pre-determined proportions of a first composition and a second composition according to the invention. In another embodiment the three-dimensional object is comprised of a core consisting of a multiplicity of construction layers, wherein the construction layers are prepared by combining pre-determined proportions of a first composition and a second composition according to the invention.

One embodiment of the present invention provides a three-dimensional object including the composition according the invention.

In one embodiment of the present invention, the three-dimensional object further includes a multiplicity of support layers for supporting the core. The support layers are prepared by combining pre-determined proportions of the first interface material and the second interface material. The support layers may be designed exactly like to construction layers, or may be designed to be weaker (lower modulus of elasticity) than the construction layers.

In one embodiment of the present invention, the three-dimensional object may further include a multiplicity of support layers for supporting the core, wherein the support layers are prepared by combining pre-determined proportions of the first composition and the second composition. In another embodiment, the support layers support the construction layers. In another embodiment, the support layers have the same strength as the construction layers. In another embodiment, the support layers have the same modulus of elasticity as the construction layers. In another embodiment, the support layers have a lower modulus of elasticity and/or a lower strength than the construction layers.

In one embodiment of the present invention, the three-dimensional object further includes a multiplicity of release layers for releasing the support layers from the construction layers. In one embodiment of the present invention, the release layers are positioned between the support layers and the construction layers. The release layers are prepared by combining pre-determined proportions of the first interface material and the second interface material.

In one embodiment of the present invention, the three-dimensional object may further include a multiplicity of release layers for releasing the support layers from the core, wherein the release layers are positioned between the support layers and the construction layers; wherein the release layers are prepared by combining pre-determined proportions of the first composition and the second composition. In another embodiment, the release layers have a lower modulus of elasticity and/or a lower strength than the construction layers and the support layers.

It will be appreciated by persons skilled in the art that the present invention is not limited by what has been particularly shown and described herein above and that numerous modifications, all of which fall within the scope of the present invention, exist.

Rather, the scope of the invention is defined by the claims which follow:

1. A composition suitable for support in building a three dimensional object, the composition comprising:
   at least one curable component,
   at least one non-curable component, the non-curable component being a polyol or a glycol wherein none of said non-curable components is reactive with any of said curable components;
   wherein said composition has a first viscosity of 20-500 cps at ambient temperature, and a second viscosity of less than 20 cps at temperature higher than the ambient temperature;
   wherein, after irradiation, the composition results in a solid, a semi solid or a gel material.

2. The composition of claim 1, wherein after irradiation, the composition results in a material, which is at least partially soluble in water.

3. The composition of claim 1, wherein after irradiation, the composition results in a material capable of swelling in water, alkaline water, acidic water or water detergent solution.

4. The composition of claim 1, wherein the non-curable component is a glycol.

5. The composition of claim 1, wherein said curable component is a water-miscible or water-soluble component.

6. The composition of claim 5, wherein said curable component is an acrylic monomer, an acrylic oligomer, (meth) acrylic or any combination thereof.

7. The composition of claim 5, wherein said curable component is polyethylene glycol monoacrylate, polyethylene glycol diacrylate, methoxypolyethylene glycol monomethacrylate, a (meth)acrylated urethane oligomer derivative of polyethylene glycol, polyethylene glycol urethane diacrylate, a partially (meth)acrylated polyol oligomer, a (meth)acrylated oligomer having hydrophilic substituents, betha-carboxyethyl acrylate, acrylamide, acryloylmorpholine (ACMO) or any combination thereof.

8. The composition according to claim 7, wherein the hydrophilic substituents of the (meth)acrylated oligomer are acidic substituents, amino substituents, hydroxy substituents, or any combination thereof.

9. The composition according to claim 1, further comprising an inhibitor.

10. The composition according to claim 1, further comprising a free radical photo-initiator.

11. The composition according to claim 1, further comprising a cationic photo-initiator or a combination of a free radical photo-initiator and a cationic photo-initiator.

12. The composition according to claim 1, further comprising a pigment, a dye or a combination thereof.

13. The composition according to claim 1, further comprising sodium bicarbonate, calcium carbonate or a combination thereof.

14. The composition according to claim 1, further comprising a filler.

15. The composition according to claim 1, wherein the temperature higher than the ambient temperature is higher than 40° C.

* * * * *